US007982364B2

(12) United States Patent
Takayama et al.

(10) Patent No.: US 7,982,364 B2
(45) Date of Patent: Jul. 19, 2011

(54) SURFACE ACOUSTIC WAVE DEVICE AND METHOD FOR MANUFACTURING THE SAME

(75) Inventors: Ryouichi Takayama, Osaka (JP); Mitsuhiro Furukawa, Hyogo (JP); Atsushi Takano, Osaka (JP)

(73) Assignee: Panasonic Corporation, Osaka (JP)

( * ) Notice: Subject to any disclaimer, the term of this patent is extended or adjusted under 35 U.S.C. 154(b) by 274 days.

(21) Appl. No.: 11/887,589

(22) PCT Filed: Mar. 30, 2006

(86) PCT No.: PCT/JP2006/306673
§ 371 (c)(1),
(2), (4) Date: Oct. 1, 2007

(87) PCT Pub. No.: WO2006/106831
PCT Pub. Date: Oct. 12, 2006

(65) Prior Publication Data
US 2009/0051245 A1  Feb. 26, 2009

(30) Foreign Application Priority Data
Apr. 1, 2005  (JP) .................. 2005-105877

(51) Int. Cl.
*H03H 9/125* (2006.01)

(52) U.S. Cl. ............. 310/313 R; 310/313 A; 310/313 B

(58) Field of Classification Search ............. 310/313 R, 310/313 A, 313 B
See application file for complete search history.

(56) References Cited

U.S. PATENT DOCUMENTS

| 4,931,851 | A  | * | 6/1990  | Sibbald et al. ............... 257/414 |
| 6,181,015 | B1 | * | 1/2001  | Gotoh et al. .................. 257/778 |
| 6,492,194 | B1 | * | 12/2002 | Bureau et al. ................. 438/106 |
| 6,928,718 | B2 | * | 8/2005  | Carpenter ....................... 29/594 |
| 7,274,129 | B2 | * | 9/2007  | Ueda et al. ................. 310/313 R |
| 2004/0207033 | A1 | * | 10/2004 | Koshido ........................ 257/415 |
| 2006/0290238 | A1 | * | 12/2006 | Ozaki ........................... 310/340 |

FOREIGN PATENT DOCUMENTS

| EP | 0 939 485    | 9/1999 |
| EP | 1 458 094    | 9/2004 |
| JP | 07-154191    | 6/1995 |
| JP | 8-213874     | 8/1996 |
| JP | 2001-176995  | 6/2001 |
| JP | 2003-174107  | 6/2003 |
| JP | 2003-188669  | 7/2003 |

OTHER PUBLICATIONS

International Search Report issued Jun. 20, 2006 in the International (PCT) Application No. PCT/JP2006/306673 of which the present application is the U.S. National Stage.
Japanese Office Action issued Jan. 25, 2011 in corresponding Japanese Application No. 2007-512859.

* cited by examiner

*Primary Examiner* — Walter Benson
*Assistant Examiner* — Bryan P Gordon
(74) *Attorney, Agent, or Firm* — Wenderoth, Lind & Ponack, L.L.P.

(57) ABSTRACT

A surface acoustic wave device includes a piezoelectric substrate and a lid spaced apart from each other oppositely by a specific interval. A comb electrode and a pad electrode are provided to the piezoelectric substrate on a main surface on the lid side, and an external terminal is provided to the lid on a surface on the opposite side to the piezoelectric substrate. Further, the surface acoustic wave device includes a connection electrode that electrically connects the pad electrode and the external terminal, and an insulator interposed between at least one of the main surface of the piezoelectric substrate and the pad electrode and the lid.

9 Claims, 6 Drawing Sheets

SURFACE ACOUSTIC WAVE DEVICE AND METHOD FOR MANUFACTURING THE SAME

BACKGROUND OF THE INVENTION

I. Technical Field of the Invention

The present invention relates to a surface acoustic wave device used in various mobile communication terminals or the like and to a method for manufacturing the same.

II. Description of Related Art

Hereinafter, a conventional surface acoustic wave device will be described.

Recently, a surface acoustic wave device has been used often in electronic equipment, such as various mobile communication terminals (for example, mobile phones), and there has been an increasing need to further reduce the surface acoustic wave device in size and in height to meet a size reduction of the equipment. To satisfy this need, it has been proposed to reduce the surface acoustic wave device in size and height by, as is shown in FIG. 6, flip-chip mounting an element 2 provided with a comb electrode 1 on a circuit board 3 with the use of a bump 4 and then covering the element 2 with a resin film 5.

The equipment, however, is now designed in modular form, and because molding is performed after the surface acoustic wave device is mounted on the board, a considerable force is applied to the element during molding, which raises a problem that the bump is broken in some cases.

As prior art document information relevant to the invention of the present application, there is JP-A-2001-176995.

SUMMARY OF THE INVENTION

The invention solves the problems in the prior art as discussed above, and therefore has an object to provide a surface acoustic wave device that is resistant to an external force, such as molding.

In order to achieve the above and other objects, the invention is characterized by including: a piezoelectric substrate provided with a comb electrode and a pad electrode on a main surface thereof; a lid disposed oppositely to the main surface of the piezoelectric substrate and provided with an external terminal on a surface on an opposite side to the piezoelectric substrate; a connection electrode that electrically connects the pad electrode and the external terminal; and an insulator interposed between at least one of the main surface of the piezoelectric substrate and the pad electrode and the lid.

According to the invention, because the insulator is interposed between at least one of the main surface of the piezoelectric substrate and the pad electrode and the lid, even when a pressure is applied to the piezoelectric substrate, for example, during molding, the pressure propagates from the piezoelectric substrate to the insulator directly or indirectly via the pad electrode, which lessens a force applied to the connection electrode. It is thus possible to obtain a surface acoustic wave device that is resistant to breaking of the connection electrode caused by an external force, such as molding.

DETAILED DESCTIPTION OF THE INVENTION

Hereinafter, a first embodiment of the invention will be described.

Figure 1:
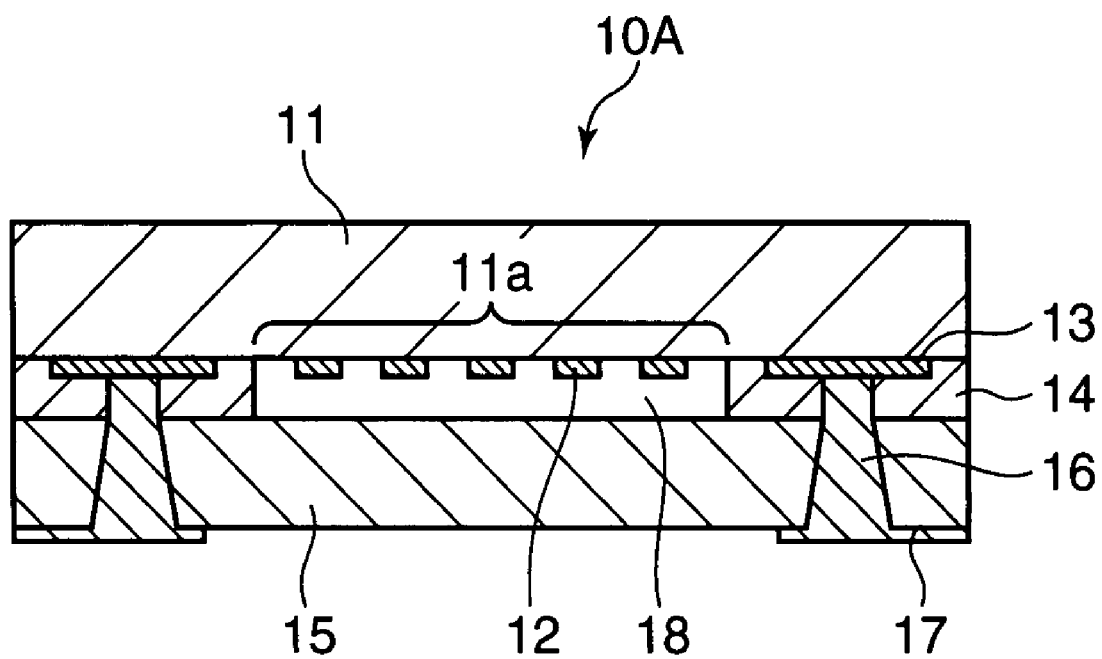
FIG. 1 is a cross section of a surface acoustic wave device according to a first embodiment of the invention.

FIG. 1 is a cross section of a surface acoustic wave device 10A according to the first embodiment of the invention. As is shown in FIG. 1, the surface acoustic wave device 10A includes a piezoelectric substrate 11 and a lid 15 spaced apart from each other oppositely at a specific interval (about 5 µm in this embodiment).

The piezoelectric substrate 11 is made of about 0.25-mm-thick lithium tantalate, and a comb electrode 12, a pad electrode 13, and so forth are provided on the main surface thereof on the lid 15 side. An active region 11a in the main surface of the piezoelectric substrate 11 within which the comb electrode 12, a reflection electrode (not shown), and so forth are disposed for propagating a surface acoustic wave is open in air. However, a region outside the active region 11a is covered with an insulator 14 made of oxide silicon via the pad electrode 13 in a portion where the pad electrode 13 is present and directly in the rest portion. In other words, the insulator 14 is interposed between the main surface of the piezoelectric substrate 11 and the lid 15 and between the pad electrode 13 and the lid 15 so as to surround the active region 11a of the piezoelectric substrate 11. The maximum thickness of the insulator 14 is about 5 µm, which is equal to the specific interval described above.

The lid 15 is made of about 0.2-mm-thick glass. The lid 15 is joined to the insulator 14 and a space therebetween is sealed. More specifically, a space 18 surrounded by the active region 11a of the piezoelectric substrate 11, the insulator 14, and the lid 15 is maintained hermetically. Further, an external terminal 17 is provided to the lid 15 on the surface on the opposite side to the piezoelectric substrate 11 at a position corresponding to the pad electrode 13. The external electrode 17 is electrically connected to the pad electrode 13 by a connection electrode 16 made of titanium, copper, and nickel and provided inside a hole penetrating through the insulator 14 and the lid 15.

An elasticity modulus of the insulator 14 is about 70 GPa, an elasticity modulus of the piezoelectric substrate 11 is about 135 GPa, and an elasticity modulus of the lid 15 is about 64 GPa. In short, the insulator 14 has an elasticity modulus between the elasticity modulus of the piezoelectric substrate 11 and the elasticity modulus of the lid 15.

In a conventional surface acoustic wave device, when a force is applied thereon from the back surface of the element, the force is applied directly to the bump. On the contrary, in the surface acoustic wave device 10A configured as described above, because the insulator 14 is interposed between the main surface of the piezoelectric substrate 11 and the lid 15 and between the pad electrode 13 and the lid 15, even when a pressure is applied to the piezoelectric substrate 11, for example, during molding, the pressure propagates from the piezoelectric substrate 11 not only directly to the insulator 14 but also indirectly to the insulator 14 via the pad electrode 13. The force is thus dispersed and a force applied to the connection electrode 16 is lessened. Hence, because the resistance to an external force can be enhanced, it is possible to obtain a surface acoustic wave device that is resistant to breaking of the connection electrode 16 caused by an external force, such as molding.

Further, because the periphery of the connection electrode 16 is entirely covered with the insulator 14, even when a pressure is applied to the piezoelectric substrate 11 locally, it is possible to prevent breaking of the connection electrode 16 effectively.

In addition, the space 18 faced by the active region 11*a* of the piezoelectric substrate 11 is maintained hermetically by surrounding the space 18 with the piezoelectric substrate 11, the lid 15, and the insulator 14. This configuration eliminates additional encapsulation necessary for a normal surface acoustic wave device.

Meanwhile, because the conventional surface acoustic wave device requires a region for encapsulation on the periphery of the element, the size of the device becomes larger than the size of the element. On the contrary, because there is no need for the surface acoustic wave device 10A to separately provide a region for encapsulation, it is possible to reduce the device in size.

In the case of a ladder type surface acoustic wave filter in which plural surface acoustic wave resonators are connected, it is preferable to surround each resonator separately by the insulator 14. When configured in this manner, it is possible to support the lid 15 on a broad surface other than the active region 11*a*, which can in turn further enhance the resistance to an external force. A concrete configuration in this case will be described in a second embodiment below.

Figure 3:
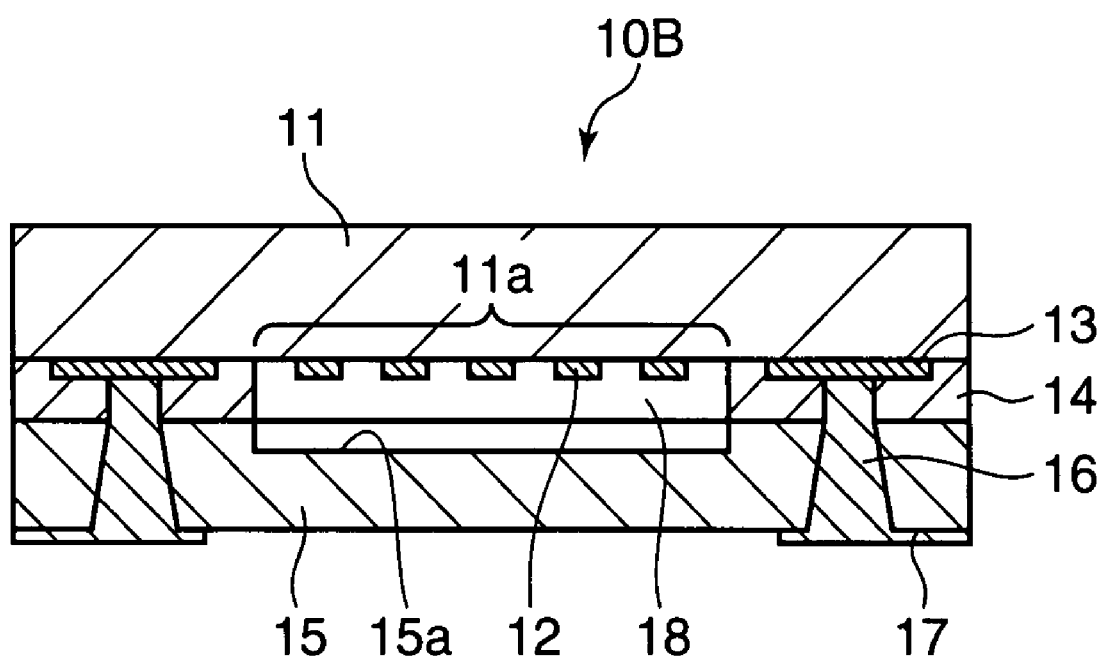
FIG. 3 is a cross section of a surface acoustic wave device according to a modification of the first embodiment.

In order to secure a larger space 18 faced by the active region 11*a*, as with a surface acoustic wave device 10B shown in FIG. 3 as a modification, a concave portion 15*a* may be provided to the lid 15 by making a dent in a region opposing the active region 11*a*. The insulator 14 plays a role to secure a specific space between the piezoelectric substrate 11 and the lid 15 in preventing the lid 15 from coming into contact with the comb electrode 12. However, when the lid 15 has the concave 15*a*, it is possible to secure a space that prevents a contact between the lid 15 and the comb electrode 12 using the concave 15*a*. It is thus possible to set the insulator 14 thinner, which can in turn reduce the device in height.

A method for manufacturing the surface acoustic wave device 10A will now be described.

Figure 2A:
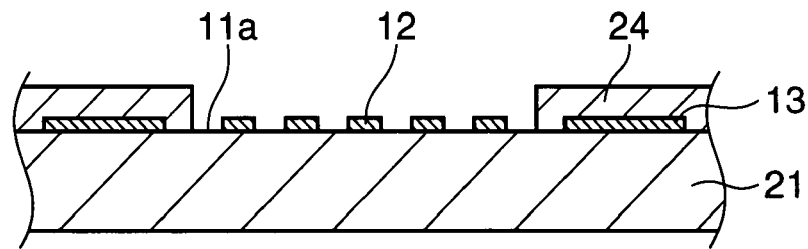
FIG. 2A through FIG. 2D are views used to describe a method for manufacturing the surface acoustic wave device according to the first embodiment of the invention.

Initially, as is shown in FIG. 2A, a wafer-shaped piezoelectric substrate 21 made of a wafer-shaped, about 0.25-mm-thick lithium tantalate is prepared. Plural piezoelectric substrates 11 described above can be cut out from the wafer-shaped piezoelectric substrate 21 by cutting the wafer-shaped piezoelectric substrate 21 lengthwise and crosswise. A surface acoustic wave device pattern, including the comb electrode 12, the reflection electrode (not shown), the pad electrode 13, and so forth, formed of a metal film chiefly made of about 0.2-μm-thick aluminum, is formed on the main surface of the wafer-shaped piezoelectric substrate 21 using a photolithographic technique. Subsequently, an insulation layer 24 made of about 5-μm-thick oxide silicon is formed across the entire surface of the wafer-shaped piezoelectric substrate 21 except for the active regions 11*a*, each including the comb electrode 12, the reflection electrode, and so forth, through which a surface acoustic wave propagates. The insulation layer 24 is cut into the insulators 14 described above in a dicing step described below. A method for forming the pattern of the insulator 14 may be a method of forming a resist pattern after the insulation layer 24 is formed across the entire main surface of the wafer-shaped piezoelectric substrate 21 by means of sputtering vapor deposition and then removing the insulation layer 24 on the active regions 11*a* by means of dry etching, or a method of forming the pattern by means of lift-off. In addition, it is preferable that the top surface of the insulation layer 24 is flat for a joining step performed later. However, normal vapor deposition readily gives rise to a step due to the thickness of the electrodes, such as the pad electrode 13. Nevertheless, by applying a bias voltage when the insulation layer 24 is formed by means of sputtering vapor deposition, a film can be formed while scraping the insulation layer 24. It is thus possible to flatten the top surface of the insulation layer 24 to the extent that no inconvenience is caused in the joining step. surface of the insulation layer 24 is flat for a joining step performed later. However, normal vapor deposition readily gives rise to a step due to the thickness of the electrodes, such as the pad electrode 13. Nevertheless, by applying a bias voltage when the insulation layer 24 is formed by means of sputtering vapor deposition, a film can be formed while scraping the insulation layer 24. It is thus possible to flatten the top surface of the insulation layer 24 to the extent that no inconvenience is caused in the joining step.

Figure 2B:
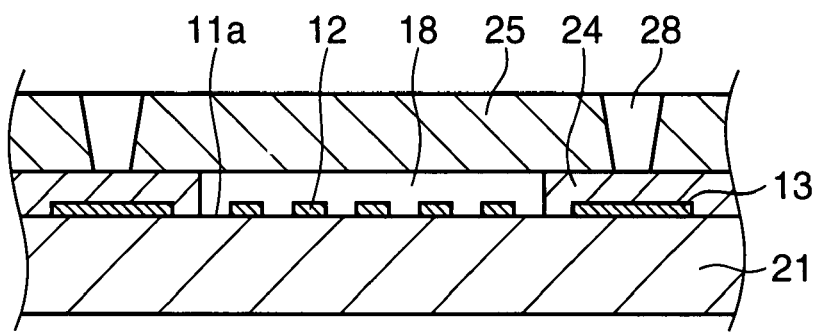

Subsequently, as is shown in FIG. 2B, a wafer-shaped lid substrate 25 made of about 0.2-mm-thick glass is prepared. Plural lids 15 described above can be cut out from the wafer-shaped lid substrate 25 by cutting the wafer-shaped lid substrate 25 lengthwise and crosswise. The waver-shaped lid substrate 25 is then joined onto the top surface of the insulation layer 24. As a method of joining the top surface of the insulation layer 24 and the wafer-shaped substrate 25, a method of joining them directly, a method of bonding them using water glass, and so forth can be adopted.

The wafer-shaped lid substrate 25 is provided with through-holes 28 for providing the connection electrodes 16 at portions opposing the pad electrodes 13. The through-holes 28 are not necessarily made before joining, and the through-holes 28 may be made after the wafer-shaped lid substrate 25 is joined to the top surface of the insulation layer 24. It is, however, preferable to make them before joining in terms of workability.

In a case where the through-holes 28 are provided after the wafer-shaped lid substrate 25 is joined to the insulation layer 24, methods, such as sand blasting and laser beam machining, can be adopted as means for this purpose. In a case where hermetic encapsulation is achieved by filling through-holes, in general, hermeticity cannot be maintained unless the wall surfaces of the through-holes are made smooth. However, in the first embodiment, because the through-holes 28 do not come into contact with the hermetically encapsulated region, hermetic encapsulation remains unsusceptible to an adopted method even when a simple method, such as sand blasting and laser beam machining, is adopted.

Figure 2C:
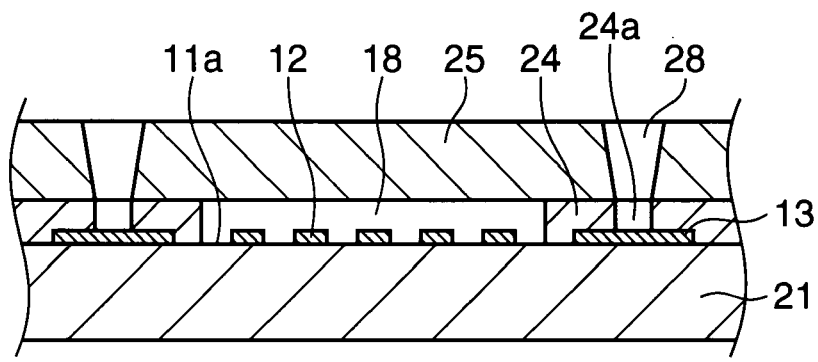

Subsequently, as is shown in FIG. 2C, holes 24*a* are made in the insulation layer 24 so as to reach the pad electrodes 13 by utilizing the through-holes 28 by means of dry etching using a fluorine etching gas, such as $C_2F_6$. Because a fluorine etching gas hardly etches away the pad electrodes 13 chiefly made of aluminum, when viewed from the wafer-shaped lid substrate 25, the pad electrodes 13 are exposed through the through-holes 28 and the holes 24*a*. In a case where the through-holes 28 are not made in the wafer-shaped lid substrate 25 in advance, the wafer-shaped lid substrate 25 is patterned with resist followed dry etching until the cutting reaches the pad electrodes 13.

Figure 2D:
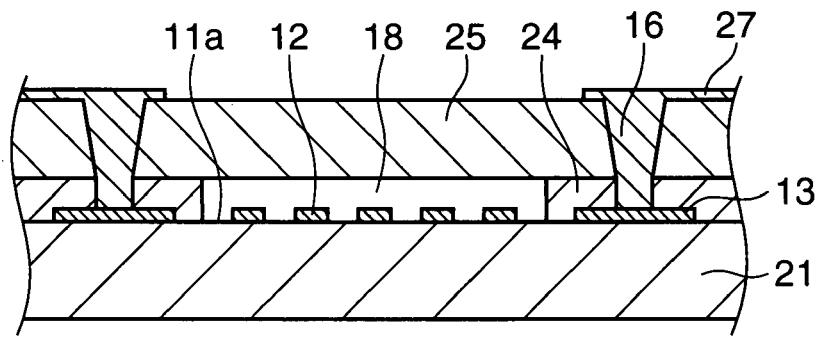

Subsequently, as is shown in FIG. 2D, titanium and copper are vapor deposited onto the wafer-shaped lid substrate 25 by means of sputtering so as to form a pattern of the external terminal layer 27 and metallize the inner surfaces of the through-holes 28. Nickel is then plated on the foregoing to fill the through-holes 28. The connection electrodes 16 that electrically connect the pad electrodes 13 and the external terminal layer 27 are thus formed. The external terminal layer 27 is cut into the external connection terminals 17 described above in the dicing step described below. It should be noted, however, that the through-holes 28 are not necessarily filled with the connection electrodes 16 completely in order to achieve the effects of the invention.

Subsequently, the wafer-shaped piezoelectric substrate 21, the insulation layer 24, the wafer-shaped lid substrate 25, and the external terminal layer 27 are cut according to specific dimensions by means of dicing to make individual piezoelectric substrates 11 and lids 15. Individual surface acoustic wave devices 10A are thus obtained. It is thus possible to manufacture plural surface acoustic wave devices 10A at a time.

When materials having considerable differences in elasticity modulus are laminated one to another and then diced simultaneously, chipping readily occurs at the interfaces. However, as in the first embodiment, when the insulation layer 24 has an elasticity modulus between the elasticity modulus of the wafer-shaped piezoelectric substrate 21 and the elasticity modulus of the wafer-shaped lid substrate 25, a difference in elasticity modulus between adjacent materials can be made smaller. It is thus possible to reduce the frequency of occurrence of chipping caused by dicing when manufacturing the surface acoustic wave devices.

The thickness of the device may be reduced by grinding the wafer-shaped piezoelectric substrate 21 on the surface opposite to the main surface after the wafer-shaped piezoelectric substrate 21 and the wafer-shaped lid substrate 25 are joined to each other via the insulation layer 24. In the first embodiment, because the wafer-shaped piezoelectric substrate 21 is supported on the insulation layer 24 over a broad surface other than the active regions 11a, the wafer-shaped piezoelectric substrate 21 hardly breaks by the grinding. It is thus possible to reduce the surface acoustic wave device in height. Further, the grinding can roughen the wafer-shaped piezoelectric substrate 21 on the surface opposite to the active regions 11a. It is thus possible to achieve another effect that deterioration in characteristic caused by unwanted reflection of a bulk wave can be suppressed.

Figure 4:
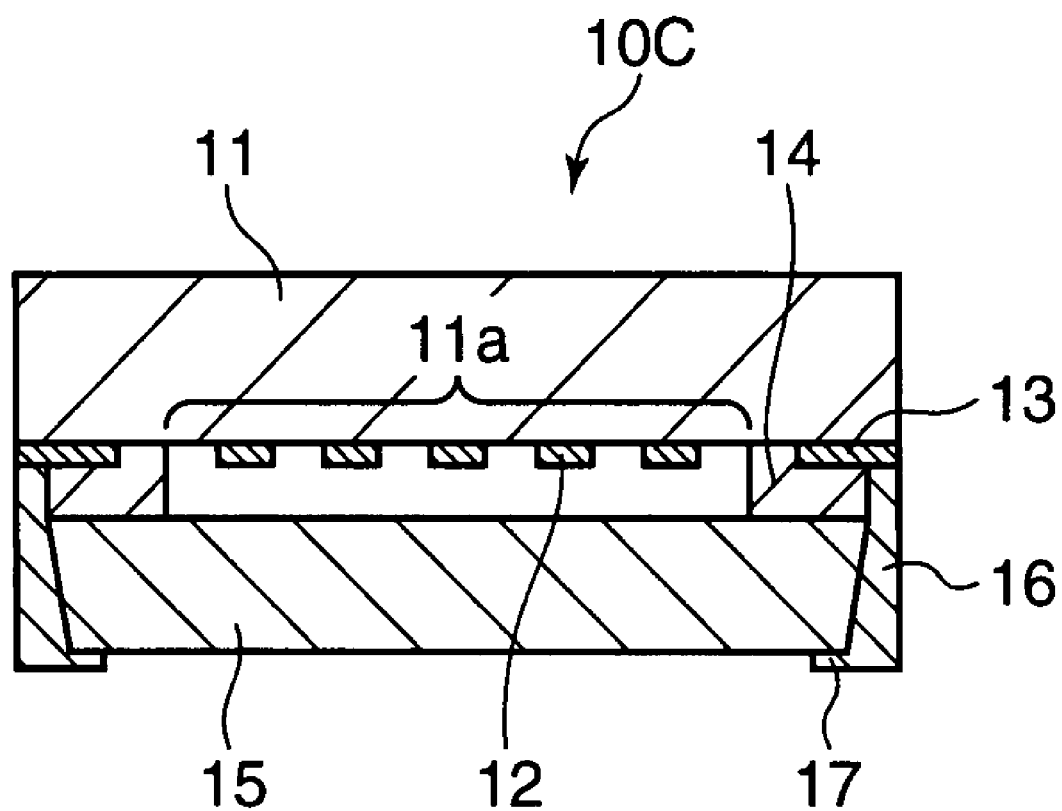
FIG. 4 is a cross section of a surface acoustic wave device according to another modification of the first embodiment.

When the dicing is performed, the wafer-shaped piezoelectric substrate 21 and the wafer-shaped lid substrate 25 may be cut along lines dividing the respective connection electrodes 16. When configured in this manner, as is shown in FIG. 4, it is possible to obtain a surface acoustic wave device 10C in which the connection electrode 16 is disposed on the end face of the lid 15. In comparison with the surface acoustic wave device 10A shown in FIG. 1 in which the connection electrode 16 penetrates through the lid 15, the surface acoustic wave device 10C is able to achieve a size reduction of the device by the area of a portion of the lid 15 positioned outside the connection electrode 16.

Figure 5A:
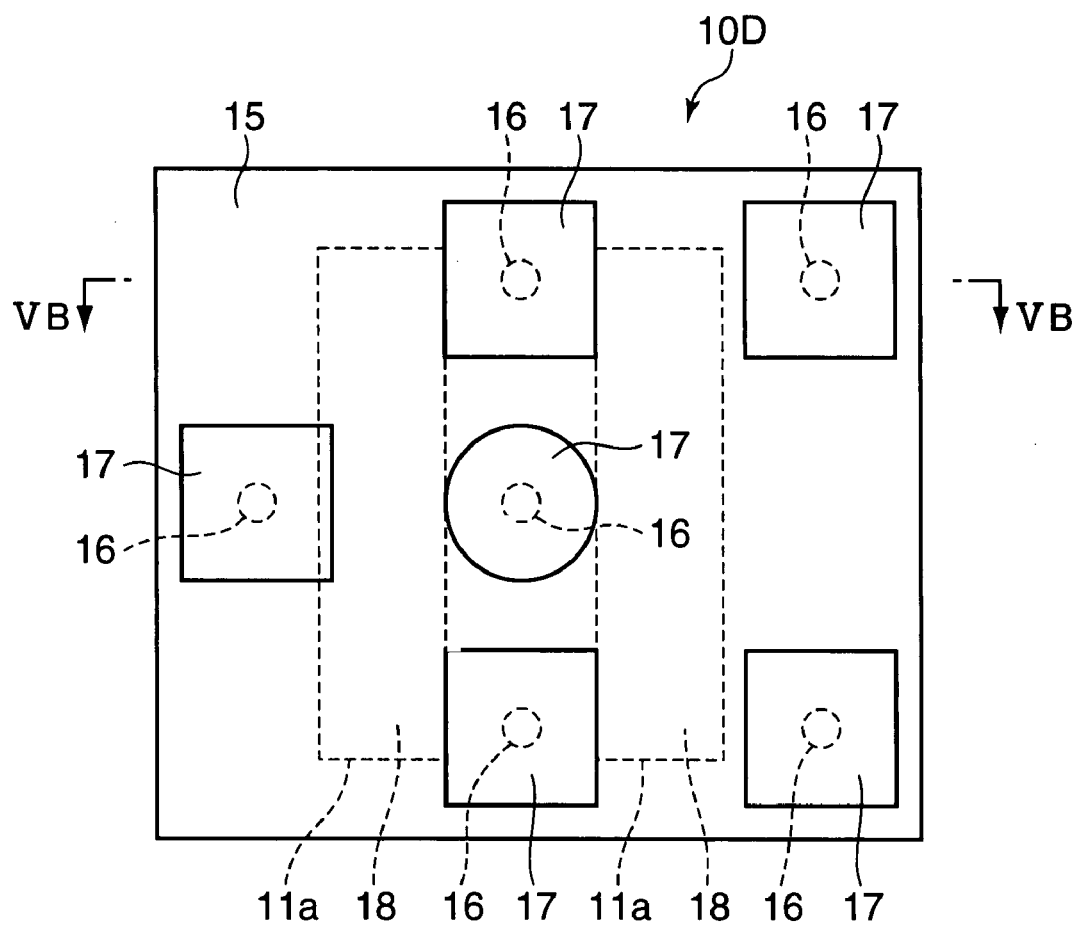
FIG. 5A is a bottom view of a surface acoustic wave device according to a second embodiment of the invention.
Figure 5B:
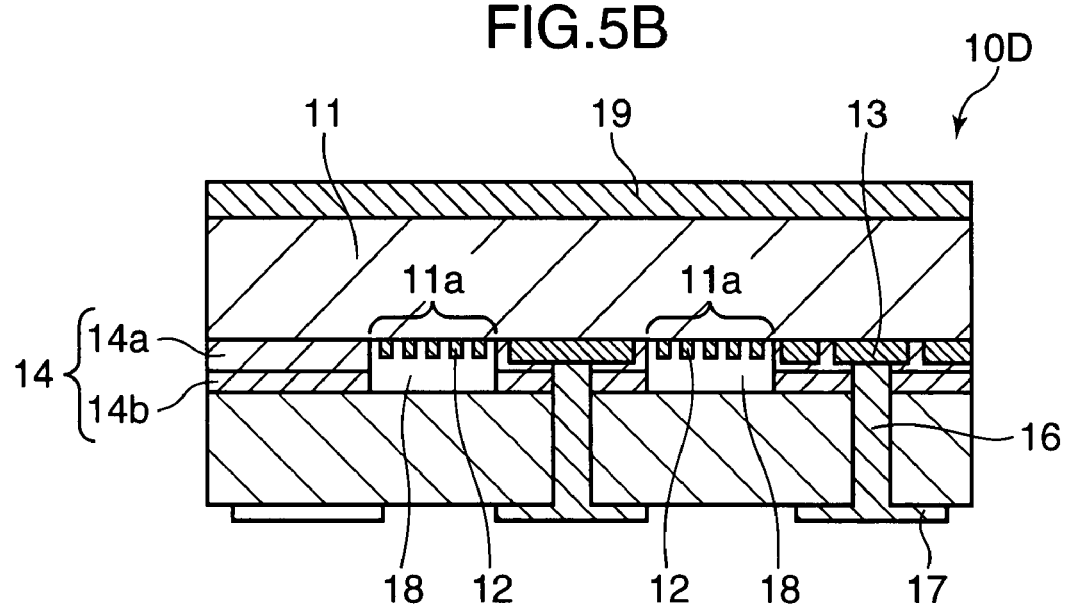
FIG. 5B is a cross section taken on line VB-VB of FIG. 5A.
Figure 6:
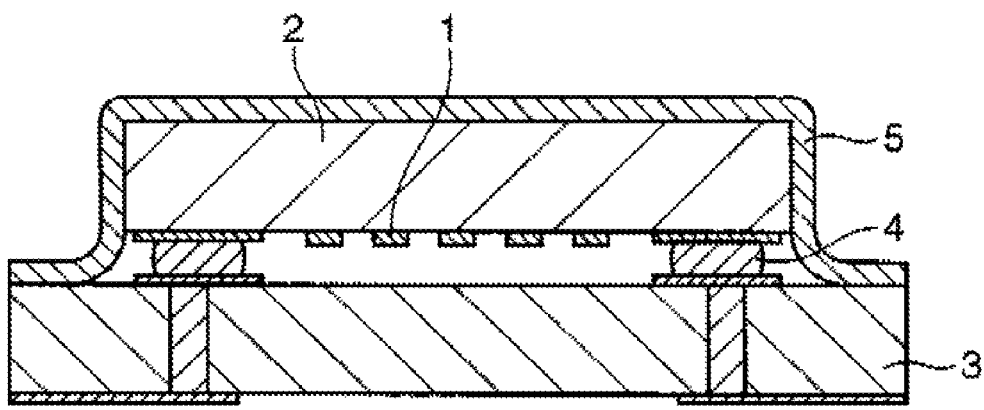
FIG. 6 is a cross section of a conventional surface acoustic wave device.

A surface acoustic wave device 10D according to a second embodiment of the invention will now be described with reference to FIG. 5A and FIG. 5B.

In the surface acoustic wave device 10D, the piezoelectric substrate 11 has two or more active regions 11a, and the insulator 14 is provided so as to surround each active region 11a separately. In other words, a region other than the two active regions 11a in the main surface of the piezoelectric substrate 11 is covered with the insulator 14. It is sufficient for the piezoelectric substrate 11 to have at least two active regions 11a, and it may have three or more active regions 11a.

Further, a resin layer 19 is provided to the piezoelectric substrate 11 across the entire surface opposite to the main surface.

In the second embodiment, the insulator 14 is formed of two layers: an oxide silicon layer 14a and a resin layer 14b. Examples of resin that can be adopted for the resin layer 14b include but not limited to epoxy and polyimide. It is sufficient for the insulator 14 to include at least the resin layer 14b. Hence, the insulator 14 is not necessarily formed of two layers entirely, and it may be formed of two layers only partially. Alternatively, the insulator 14 may be formed of three or more layers essentially including the resin layer 14b.

When the insulator 14 is provided to surround each active region 11a separately as has been described, it is possible to secure a larger contact area between the piezoelectric substrate 11 and the insulator 14, which can in turn further lessen a force applied to the connection electrode 16.

In addition, because the resin layer 19 is provided to the piezoelectric substrate 11 on the surface opposite to the main surface, a bulk wave propagating inside the piezoelectric substrate 11 from the main surface to the opposite surface is absorbed by the resin layer 19. This reduces a ratio of a bulk wave reflected on the opposite surface and returned to the main surface. It is thus possible to reduce deterioration of the frequency characteristic caused by reflection of a bulk wave.

Further, because the insulator 14 includes the resin layer 14b, it is possible to reduce the peak value of stress induced in the respective portions during molding, thermal shock, or the like by elastic deformation of the resin layer 14b of the insulator 14.

The first embodiment and the second embodiment above have described a case where the piezoelectric substrate 11 is covered entirely with the insulator 14 except for the active region(s) 11a. It is, however, possible to lessen a force applied to the connection electrode 16 when the insulator 14 is interposed between at least one of the main surface of the piezoelectric substrate 11 and the pad electrode 13 and the lid 15.

As has been described, a surface acoustic wave device of the invention is characterized by including: a piezoelectric substrate provided with a comb electrode and a pad electrode on a main surface thereof; a lid disposed oppositely to the main surface of the piezoelectric substrate and provided with an external terminal on a surface on an opposite side to the piezoelectric substrate; a connection electrode that electrically connects the pad electrode and the external terminal; and an insulator interposed between at least one of the main surface of the piezoelectric substrate and the pad electrode and the lid.

According to this configuration, because the insulator is interposed between at least one of the main surface of the piezoelectric substrate and the pad electrode and the lid, even when a pressure is applied to the piezoelectric substrate, for example, during molding, the pressure propagates from the piezoelectric substrate to the insulator directly or indirectly via the pad electrode, which lessens a force applied to the connection electrode. It is thus possible to obtain a surface acoustic wave device that is resistant to breaking of the connection electrode caused by an external force, such as molding.

In the surface acoustic wave device described above, it is preferable that the insulator is interposed at least between the pad electrode and the lid, and the connection electrode penetrates through the insulator and the lid.

According to this configuration, because the insulator is present on the periphery of the connection electrode, even when a pressure is applied to the piezoelectric substrate locally, it is possible to prevent breaking of the connection electrode effectively.

In the surface acoustic wave device described above, it is preferable that the insulator is interposed between the pad electrode and the lid and between the main surface of the piezoelectric substrate and the lid so as to surround an active region in the main surface of the piezoelectric substrate with which the comb electrode is provided.

According to this configuration, it is possible to maintain a space between the active region in the main surface of the piezoelectric substrate and the lid hermetically by utilizing the insulator.

Further, it is preferable that the piezoelectric substrate has at least two active regions and the insulator is provided so as to surround each active region separately.

According to this configuration, it is possible to secure a larger contact area between the piezoelectric substrate and the insulator, which can in turn further lessen a force applied to the connection electrode.

The insulator plays a role to secure a specific space between the piezoelectric substrate and the lid in preventing the lid from coming into contact with the comb electrode. However, when the lid has a concave portion that makes a dent in a region opposing the active region in the main surface of the piezoelectric substrate with which the comb electrode is provided, it is possible to secure a space that prevents a contact between the lid and the comb electrode using the concave portion. It is thus possible to set the insulator thinner, which can in turn reduce the device in height.

In the surface acoustic wave device described above, it is preferable that the insulator has an elasticity modulus between an elasticity modulus of the piezoelectric substrate and an elasticity modulus of the lid.

When materials having considerable differences in elasticity modulus are laminated one to another and diced simultaneously, chipping readily occurs at the interfaces. However, according to the configuration described above, because a difference in elasticity modulus between adjacent materials can be made smaller, it is possible to reduce the frequency of the occurrence of chipping caused by dicing when manufacturing the surface acoustic wave device.

In the surface acoustic wave device described above, it is preferable for the surface acoustic wave device that a resin layer is provided to the piezoelectric substrate on a surface opposite to the main surface.

According to this configuration, a bulk wave propagating inside the piezoelectric substrate from the main surface to the opposite surface is absorbed by the resin layer, and a ratio of a bulk wave reflected on the opposite surface and returned to the main surface is reduced. It is thus possible to reduce deterioration of the frequency characteristic caused by reflection of a bulk wave.

In the surface acoustic wave device described above, it is preferable that the connection electrode is disposed on an end face of the lid.

According to this configuration, in comparison with a configuration in which the connection electrode penetrates through the lid, it is possible to reduce the device in size by the area of a portion of the lid positioned outside the connection electrode.

In the surface acoustic wave device described above, it is preferable that the insulator includes at least a resin layer.

According to this configuration, it is possible to reduce the peak value of stress induced in the respective portions during molding, thermal shock, or the like by elastic deformation of the resin layer of the insulator.

A method for manufacturing a surface acoustic wave device of the invention is characterized by including: a step of forming a comb electrode and a pad electrode on a main surface of a piezoelectric substrate; a step of covering the main surface of the piezoelectric substrate with an insulator in a region other than an active region within which the comb electrode is disposed; a step of joining a lid to the insulator; a step of making a hole in the insulator at a position corresponding to the pad electrode; and a step of forming a connection electrode in the hole made in the insulator.

According to this configuration, it is possible to manufacture a surface acoustic wave device that is resistant to breaking of the connection electrode caused by an external force, such as molding.

For example, the step of making the hole in the insulator may include a step of making the hole by means of dry etching.

In the method for manufacturing a surface acoustic wave device described above, it is preferable that the step of joining the lid to the insulator includes a step of preparing the lid provided with a through-hole for forming the connection electrode.

According to this configuration, a hole for forming the connection electrode can be readily made in the insulator by utilizing the through-hole made in the lid.

In the method for manufacturing a surface acoustic wave device described above, it is preferable that: the step of forming the comb electrode and the pad electrode on the main surface of the piezoelectric substrate includes a step of preparing a wafer-shaped piezoelectric substrate; the step of joining the lid to the insulator includes a step of preparing a wafer-shaped lid substrate; and the method further includes a step of cutting the wafer-shaped piezoelectric substrate and the wafer-shaped lid substrate into individual piezoelectric substrates and lids after the step of forming the connection electrode.

According to this configuration, it is possible to manufacture plural surface acoustic wave devices at a time.

Further, it is preferable that the step of cutting the wafer-shaped piezoelectric substrate and the wafer-shaped lid substrate includes a step of cutting the wafer-shaped piezoelectric substrate and the wafer-shaped lid substrate along a line dividing the connection electrode.

According to this configuration, it is possible to manufacture a compact surface acoustic wave device in which the connection electrode is disposed on the end face of the lid.

The invention reduces a surface acoustic wave device in size and in height while enhancing the resistance to an external force, and is therefore industrially useful.

The invention claimed is:

1. A surface acoustic wave device having an outer peripheral portion in a circumferential direction thereof, said surface acoustic wave device comprising:
   a piezoelectric substrate including a main surface with a comb electrode and a pad electrode disposed on the main surface;
   a lid disposed opposite the main surface of the piezoelectric substrate, the lid including a first surface facing the main surface of the piezoelectric substrate and a second surface on a side opposite the first surface, and including an external terminal disposed on the second surface;
   a connection electrode that electrically connects the pad electrode and the external terminal; and
   an insulator interposed between at least one of the main surface of the piezoelectric substrate and the pad electrode and the lid, wherein only the piezoelectric substrate, the insulator, and the lid form a laminated portion at at least a portion of the outer peripheral portion of the surface acoustic wave device, and the insulator has an elasticity modulus between an elasticity modulus of the piezoelectric substrate and an elasticity modulus of the lid.

2. The surface acoustic wave device according to claim 1, wherein:

the insulator is interposed at least between the pad electrode and the lid, and the connection electrode penetrates through the insulator and the lid.

3. The surface acoustic wave device according to claim 1, wherein:

the insulator is interposed between the pad electrode and the lid and between the main surface of the piezoelectric substrate and the lid so as to surround an active region in the main surface of the piezoelectric substrate with which the comb electrode is provided.

4. The surface acoustic wave device according to claim 3, wherein:

the piezoelectric substrate has at least two active regions and the insulator is disposed so as to surround each active region separately.

5. The surface acoustic wave device according to claim 1, wherein:

the lid has a concave portion that forms a dent in a region opposing an active region in the main surface of the piezoelectric substrate on which the comb electrode is disposed.

6. The surface acoustic wave device according to claim 1, wherein:

the piezoelectric substrate includes a surface opposite to the main surface and a resin layer is disposed on the piezoelectric substrate on the surface opposite to the main surface.

7. The surface acoustic wave device according to claim 1, wherein:

the lid includes an end face, and the connection electrode is disposed on the end face of the lid.

8. The surface acoustic wave device according to claim 1, wherein:

the insulator includes at least a resin layer.

9. The surface acoustic wave device according to claim 1, wherein:

the piezoelectric substrate, the insulator and the lid are configured and arranged so as to prevent chipping during manufacturing.

* * * * *